(12) United States Patent
Eckardt et al.

(10) Patent No.: US 10,255,144 B2
(45) Date of Patent: Apr. 9, 2019

(54) DECODING DEVICE AND METHOD USING CONTEXT REDUNDANCY

(71) Applicant: Intel IP Corporation, Santa Clara, CA (US)

(72) Inventors: Florian Eckardt, Dresden (DE); Zhibin Yu, Unterhaching (DE); Qing Xu, Unterhaching (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/611,625

(22) Filed: Jun. 1, 2017

(65) Prior Publication Data

US 2018/0018243 A1    Jan. 18, 2018

(30) Foreign Application Priority Data

Jul. 18, 2016 (EP) .................................... 16179970

(51) Int. Cl.
| | |
|---|---|
| *H04L 1/00* | (2006.01) |
| *G06F 11/18* | (2006.01) |
| *G06F 11/14* | (2006.01) |
| *H03M 13/25* | (2006.01) |
| *H03M 13/39* | (2006.01) |
| *H03M 13/41* | (2006.01) |

(52) U.S. Cl.
CPC .......... *G06F 11/18* (2013.01); *G06F 11/1479* (2013.01); *H03M 13/256* (2013.01); *H03M 13/3994* (2013.01); *H04L 1/0054* (2013.01); *H03M 13/41* (2013.01)

(58) Field of Classification Search
CPC .... G06F 11/18; G06F 11/1479; H04L 1/0054; H03M 13/256; H03M 13/41; H03M 13/3994
See application file for complete search history.

(56) References Cited

U.S. PATENT DOCUMENTS 6,081,562 A * 6/2000 He ........................ H03M 13/41
375/262
9,660,845 B2 * 5/2017 Mitra ................. H04L 25/03203
(Continued)

OTHER PUBLICATIONS

Jong Il Park et al., "A Protocol Aided Concatenated Forward Error Control for Wireless ATM" Published in: Wireless Communications and Networking Conference, 2002. WCNC2002. 2002 IEEE, dated Mar. 17-22, 2002.
(Continued)

*Primary Examiner* — Jean B Corrielus
(74) *Attorney, Agent, or Firm* — Lowenstein Sandler LLP

(57) ABSTRACT

The disclosure relates to a decoding device, comprising: a receiver configured to provide a sequence of information bits comprising context redundancy information, wherein the sequence of information bits is encoded based on a predefined channel code; a trellis generation logic configured to generate a plurality of trellis states based on the sequence of information bits and the channel code; a trellis reduction logic configured to reduce the plurality of trellis states by at least one trellis state based on the context redundancy information; and a decoder configured to decode the sequence of information bits by using a metric based on the reduced number of trellis states.

22 Claims, 7 Drawing Sheets

(56) References Cited

U.S. PATENT DOCUMENTS

| | | | |
|---|---|---|---|
| 2003/0053535 A1* | 3/2003 | Malkov | H04L 25/03318 375/233 |
| 2007/0168847 A1* | 7/2007 | Pisek | H03M 13/41 714/795 |
| 2008/0178063 A1* | 7/2008 | Norris | H03M 13/41 714/786 |
| 2009/0041166 A1 | 2/2009 | Patel et al. | |
| 2009/0175388 A1 | 7/2009 | Chang et al. | |
| 2010/0153049 A1* | 6/2010 | Ventola | H04W 52/52 702/86 |
| 2017/0099165 A1* | 4/2017 | Mitra | H04L 25/03203 |
| 2017/0141800 A1* | 5/2017 | Bisplinghoff | H03M 13/23 |

OTHER PUBLICATIONS

European Search Report dated Feb. 9, 2017, on application No. 16179970.

* cited by examiner

DECODING DEVICE AND METHOD USING CONTEXT REDUNDANCY

RELATED APPLICATIONS

This application claims the benefit of European Patent Application No. EP 16179970.5 filed on Jul. 18, 2016, the entire contents of which is hereby incorporated by reference in its entirety.

FIELD

The disclosure relates to a decoding device and a decoding method that exploit context redundancy to reduce a number of trellis states. In particular, the disclosure relates to techniques for increasing decoding sensitivity by exploring context redundancy in mobile communication devices, in particular devices applying LTE (Long Term Evolution) D2D (device-to-device) side link communication.

BACKGROUND

In a digital communications system 100 as illustrated in FIG. 1, a stream of information bits 112 is transferred from one point to another through a communication channel 130 and is therefore susceptible to noise 132. Forward Error Correction (FEC) techniques improve the channel capacity by carefully adding redundant information to the data being transmitted 110 through the channel 130. In a FEC system, the transmitted data is encoded in such a way so that the receiver 120 can correct, as well as detect, errors caused by channel noise 132. Convolutional encoding 111 with Viterbi decoding 121 is a FEC technique that is well suited for such communication systems. The convolutional encoder 111 inserts redundant information bits into the data stream 112 so that the decoder 121 can reduce and correct errors caused by the channel 130. In today's communication networks there is a steady need for further improvement of the coding sensitivity.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION

Figure 1:
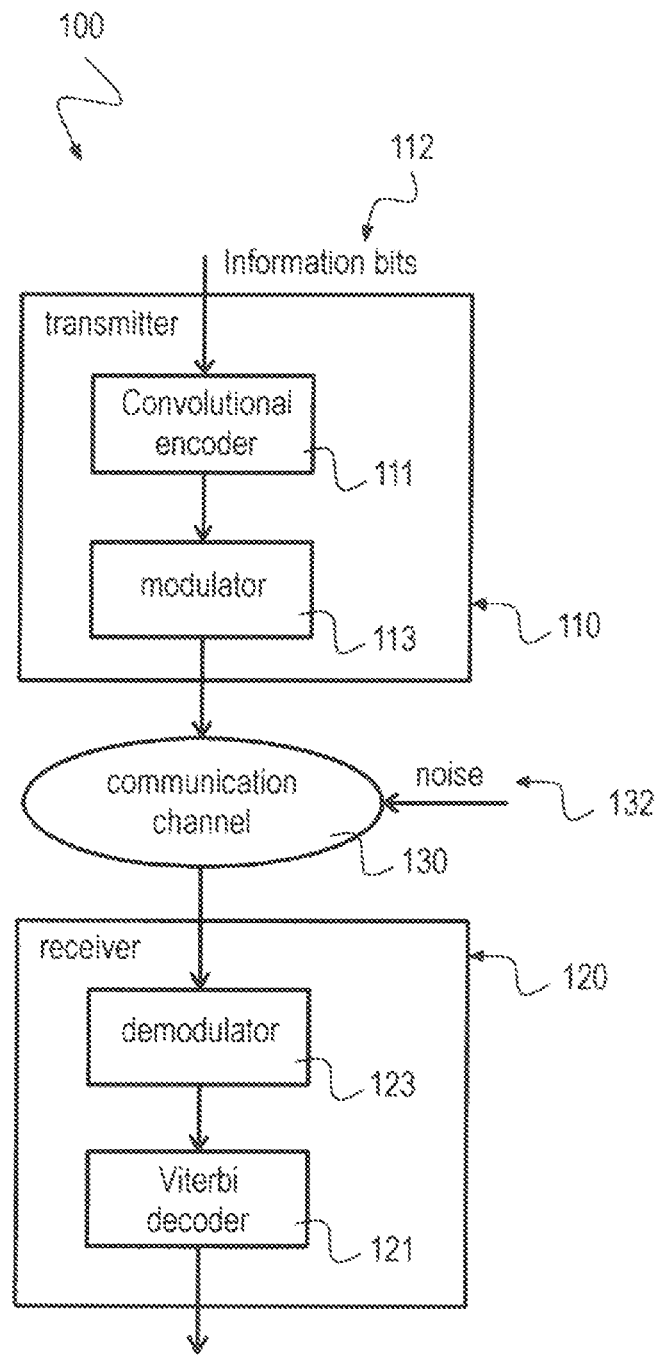
FIG. 1 is a high-level block diagram illustrating the architecture of a digital communications system 100.

In the following detailed description, reference is made to the accompanying drawings, which form a part thereof, and in which is shown by way of illustration specific aspects in which the invention may be practiced. It is understood that other aspects may be utilized and structural or logical changes may be made without departing from the scope of the present invention. The following detailed description, therefore, is not to be taken in a limiting sense, and the scope of the present invention is defined by the appended claims.

In the following, embodiments are described with reference to the drawings, wherein like reference numerals are generally utilized to refer to like elements throughout. In the following description, for purposes of explanation, numerous specific details are set forth in order to provide a thorough understanding of one or more aspects of embodiments. However, it may be evident to a person skilled in the art that one or more aspects of the embodiments may be practiced with a lesser degree of these specific details. The following description is therefore not to be taken in a limiting sense.

The various aspects summarized may be embodied in various forms. The following description shows by way of illustration various combinations and configurations in which the aspects may be practiced. It is understood that the described aspects and/or embodiments are merely examples, and that other aspects and/or embodiments may be utilized and structural and functional modifications may be made without departing from the scope of the present disclosure.

The following terms, abbreviations and notations will be used herein:
3GPP: 3rd Generation Partnership Project
LTE: Long Term Evolution
BS: base station, eNodeB
RF: radio frequency
UE: user equipment
UL: uplink
DL: downlink
TD-ULDL: time division uplink downlink configuration
OFDM: orthogonal frequency division multiplex,
MIMO: multiple input multiple output,
TDD: time division duplex
D2D: device to device
PSBCH: physical side link broadcast channel
MIB: master information block
MIB-SL: side link master information block
SLSS: side link Synchronization sub-frame
SINR: signal to interference and noise ratio
CRC: cyclic redundancy check The methods and devices described herein may be based on baseband processing methods and baseband processors for use in mobile devices and radio receivers, in particular LTE radio receivers. It is understood that comments made in connection with a described method may also hold true for a corresponding device configured to perform the method and vice versa. For example, if a specific method step is described, a corresponding device may include a unit to perform the described method step, even if such a unit is not explicitly described or illustrated in the figures. Further, it is understood that the features of the various exemplary aspects described herein may be combined with each other, unless specifically noted otherwise.

The methods and devices described herein may be implemented in wireless communication networks, in particular communication networks based on mobile communication standards such as LTE, in particular LTE-A and/or OFDM. The methods and devices described below may be implemented in mobile devices (or mobile stations or User Equipments (UE)), in particular in radio receivers of such mobile devices. The described devices may include integrated circuits and/or passives and may be manufactured according to various technologies. For example, the circuits may be designed as logic integrated circuits, analog integrated circuits, mixed signal integrated circuits, optical circuits, memory circuits and/or integrated passives.

The methods and devices described herein may be configured to transmit and/or receive radio signals. Radio signals may be or may include radio frequency signals radiated by a radio transmitting device (or radio transmitter or sender) with a radio frequency lying in a range of about 3 Hz to 300 GHz. The frequency range may correspond to frequencies of alternating current electrical signals used to produce and detect radio waves.

The methods and devices described herein after may be designed in accordance to mobile communication standards such as e.g. the Long Term Evolution (LTE) standard or the advanced version LTE-A thereof. LTE (Long Term Evolution), marketed as 4G and 5G LTE, is a standard for wireless communication of high-speed data for mobile phones and data terminals.

The methods and devices described hereinafter may be applied in OFDM systems. OFDM is a scheme for encoding digital data on multiple carrier frequencies. A large number of closely spaced orthogonal sub-carrier signals may be used to carry data. Due to the orthogonality of the sub-carriers crosstalk between sub-carriers may be suppressed.

The methods and devices described hereinafter may be applied in LTE TDD mode systems, e.g. LTE mode systems having a type 2 LTE frame structure. The type 2 LTE frame has an overall length of 10 milliseconds. The 10 ms frame comprises two half frames, each 5 ms long. The LTE half-frames are further split into five subframes, each 1 millisecond long.

The methods and devices described herein may be applied for LTE Device to Device (D2D) communication. LTE D2D communication, also named as LTE side link, is introduced since 3GPP release 12 [3GPP TS 36.211 chapter 9]. D2D works in in-coverage and (partial) out-coverage scenarios. For (partial) out-coverage scenario the D2D system information is transmitted through side link broadcast channel (PSBCH) from a D2D transmitter. PSBCH is carrying the side link MIB (MIB-SL) information (standardized according to 3GPP TS 36.331 section 6.5.2) and is embedded within the side link synchronization sub-frame (SLSS). It is coded by conventional code and the information bits of PSBCH are the following: 1. System bandwidth of D2D transmitted signal (N6, N15, N25, N50, N75 and N100). 2. Frame (0-2 ^10-1) and sub-frame (0-9) numbers of the SLSS sub-frame. 3. In case of TDD mode, the TDD UL/DL configuration. (For out-coverage UEs UL/DL config cannot be received by eNodeB SIB, but only by SLSS from another D2D transmitter). 4. A Boolean flag indicating whether the UE is within or outside of eNodeB coverage. For the (partial) out-coverage scenario, a successful decoding of PSBCH is a pre-condition of setting up the communications between two devices.

The methods and devices described herein may be applied in the field of channel coding. Usually, for channel coding, it is assumed that the information bits are uncorrelated before being encoded. Then the redundancy is only added by the coding techniques itself. In this disclosure the redundancy within the context of the information bits is further explored, which is additional redundancy on top of the channel codes. By doing this the decoding sensitivity can be further improved.

Methods and devices according to the disclosure are designed based on the concept that certain unrealistic and/or invalid trellis states in a Viterbi decoder can be forbidden or removed based on the self-context redundancies or cross-context redundancies embedded inside the information bits context, for example the D2D PSBCH. Removing those unrealistic states completely blocks the error propagation for the unrealistic paths, and therefore improves efficiency for valid maximum-likelihood path search in a Viterbi decoder, especially in low SINR conditions.

For the scenario of PSBCH in D2D, two types of context redundancies within D2D PSBCH can be used, which are the self-context redundancy and the cross-context redundancy. With respect to self-context redundancy: SLSS sub-frame index field occupies 4 bits but the range of a sub-frame index ranges from 0 to 9. So values 10 to 15 are invalid bits and the corresponding trellis states can be forbidden in PSBCH Viterbi decoder. In parallel, system bandwidth field of PSBCH occupies 3 bits, but there are only 6 valid system bandwidth alternatives (N6 to N100). It means there are $2^3-6=2$ invalid values, and therefore the trellis states which corresponds to the invalid fields in the PSBCH decoder can be removed or set to be forbidden. With respect to cross-context redundancy: SLSS sub-frame index fields and TDD UL/DL configuration field are correlated: in case of TDD, SLSS sub-frame index must be an UL sub-frame (DL sub-frames are only for eNodB reception). This restricts the possibilities of UL/DL configuration field, and vice versa. Such correlation is used to jointly optimize trellis structure in the Viterbi decoder (offline or during run-time) as described hereinafter.

The motivation is to improve the decoding sensitivity of the Viterbi decoder for the D2D PSBCH, so that, by making use of the same amount of SLSS sub-frames, a UE device can successfully decode the PSBCH at a lower signal interference noise ratio (SINR) level.

Figure 2:
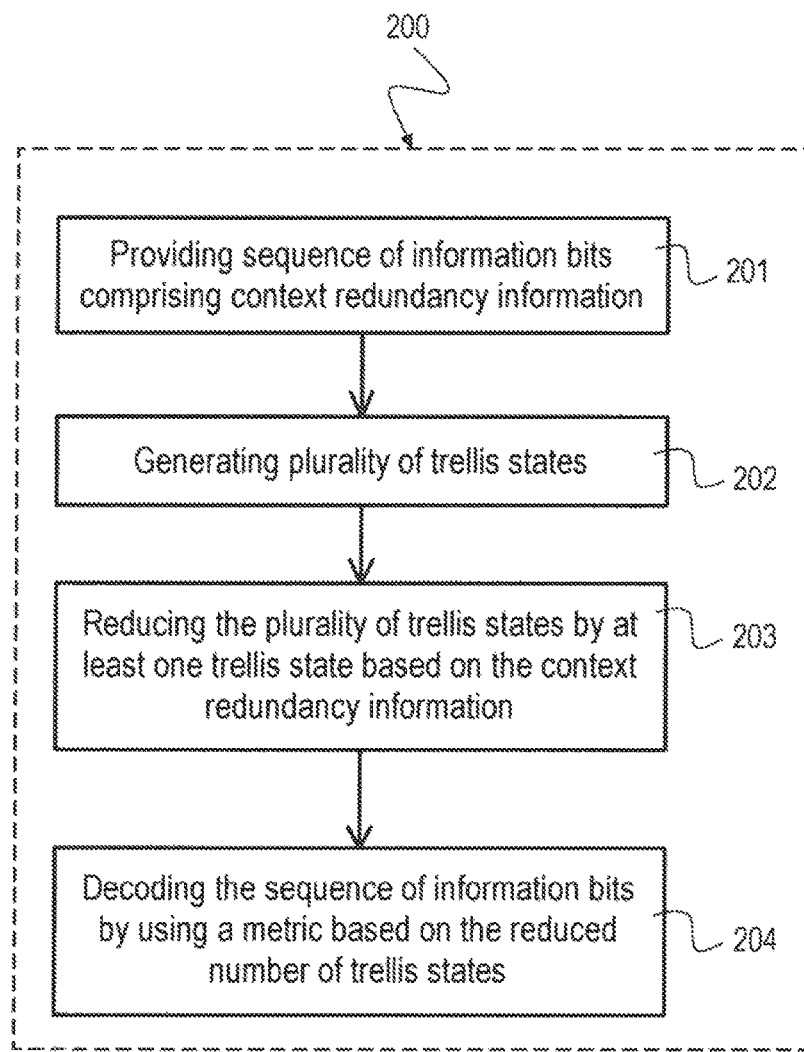
FIG. 2 schematically illustrates an exemplary decoding method 200 according to the disclosure.

FIG. 2 schematically illustrates an exemplary decoding method 200 according to the disclosure. The decoding method 200 includes providing 201 a sequence of information bits comprising context redundancy information, wherein the sequence of information bits is encoded based on a predefined channel code. The decoding method 200 includes generating 202 a plurality of trellis states based on the sequence of information bits and the channel code. The decoding method 200 includes reducing 203 the plurality of trellis states by at least one trellis state based on the context redundancy information. The decoding method 200 includes decoding 204 the sequence of information bits by using a metric based on the reduced number of trellis states.

The decoding method 200 may be used in a Viterbi decoder 121 of a receiver 120 as described above with respect to FIG. 1, where the sequence of information bits correspond to the information bits 112 which are encoded by the convolutional encoder 111 in the transmitter 110 with a predefined channel code.

The context redundancy information may be provided at predefined positions of the sequence of information bits, e.g. at bit3-bit5 and/or bit16-bit19 as described below with respect to FIG. 4. The context redundancy information may be provided as a bit field comprising at least one invalid bit combination, e.g. as TDD-ULDL-config bit field 402 and/or SLSS bub-frame number bit field 404 as described below with respect to FIG. 4. The sequence of information bits may be correlated by the context redundancy information before being encoded by the channel code.

The decoding method 200 may further include removing trellis states which correspond to invalid bit allocations in the sequence of information bits. Invalid bit allocations may be not defined bit allocations or bit allocations that cannot occur. The decoding method 200 may further include removing trellis states which correspond to invalid field combinations in the sequence of information bits. Invalid (bit) field allocations may be not defined bit field allocations or bit field allocations that cannot occur.

The decoding method 200 may further include removing trellis states which can only be reached by invalid paths. The decoding method 200 may further include providing the reduced number of trellis states during an offline processing, e.g. as described below. The decoding method 200 may further include providing the reduced number of trellis states during an online processing, e.g. as described below.

The decoding method 200 may further include providing the reduced number of trellis states based on trace back for decoding the context redundancy information, e.g. as described below with respect to FIG. 3. The decoding method 200 may further include using the decoded context redundancy information to restrict the plurality of trellis states, e.g. as described below with respect to FIG. 3. The decoding method 200 may further include providing the reduced number of trellis states based on evaluating probabilities for different possible context redundancy information, e.g. as described below with respect to FIG. 3. The decoding method 200 may further include providing the reduced number of trellis states based on evaluating hypotheses of different possible context redundancy information, e.g. as described below. The decoding method 200 may include evaluating the hypotheses based on a cyclic redundancy check, e.g. as described below with respect to FIG. 6.

The context redundancy information may include self-context redundancy information and/or cross-context redundancy information, e.g. as described below and with respect to FIG. 4. The self-context redundancy information may include self-context redundancy of a bit field indicating a side link bandwidth within a side link master information block (SL-MIB) for device-to-device (D2D) communication, e.g. as described below. The cross-context redundancy information may include cross-context redundancy between a bit field indicating a time division duplex uplink downlink (TDD-ULDL) configuration and a bit field indicating a sub-frame number (SLSS), e.g. as described below. The decoding method 200 may further include decoding the sequence of information bits based on Viterbi decoding, e.g. by a Viterbi decoder 121 as described above with respect to FIG. 1.

In the following sections specific implementations of the method 200 are described. The above described method 200 may be specifically realized by the following two methods, denoted as "method 1" and "method 2" hereinafter, each one including respective modifications, denoted as "sub-method 1 of method 1", "sub-method 2 of method 1" and "modified version of method 2" hereinafter. Each one of method 1 and method 2 may be realized either standalone or combined.

In method 1 (also denoted as the offline method) offline trellis reduction is done by removing the states corresponding to invalid information bit allocations or field combinations. For implementation, the path metric of the invalid states can be forced to be a very high value, and then it behaves equivalently like being removed. This method can also be divided into two sub-methods: the offline trellis reduction making use of self-context redundancy (i.e. invalid bit allocations) and offline trellis reduction making use of cross-context redundancy (i.e. invalid field combinations). This method does not need real-time demodulated soft-input bits so it can be done offline by PC simulation, for example.

In method 2 (also denoted as the run-time method) during Viterbi decoding, early trace back is done to early decode the TDD-ULDL-config field and use this decoded TDD-ULDL-config information to further restrict certain trellis states of the SLSS sub-frame index field. This method needs real-time received soft-input bits so it can be done in the decoding run-time. To cover all possibilities, in parallel, a modified version of this method is provided where no early trace back is done to early detect TDD-ULDL-config but different hypothesis of different possible TDD-ULDL configurations are used. Then the SLSS sub-frame number field can be restricted based on each TDD-ULDL-config hypothesis in the same way. Among maximal 8 hypotheses, for example, the whole decoded bit stream which passes CRC check is the final decoded information bits. The modified version gives even better sensitivity because the false decoding rate of early TDD-ULDL-config can be avoided. But it needs higher computation power because PSBCH decoding is performed more than once.

Each of the above described two methods (method 1, i.e. offline method and method 2, i.e. run-time method) can work as standalone without the other. But also they can work in a two-step combined way as described in the following: That is to first use the offline method to reduce the trellis before decoding is started, and then use the run-time method based on the reduced trellis for run-time decoding. This will jointly improve the decoding performance.

The above described concept as described by the methods above can be extended to other conventional-coded channels, for example LTE PDCCH as long as there are context redundancies. This concept can also be extended to other coding schemes which are based on trellis search, for example Turbo codes and LTE PDSCH, as long as there are context redundancies.

For method 1, offline trellis reduction is done by exploring the PSBCH self-context as well as cross-context redundancy. That can be done by removing unrealistic and/or invalid trellis states by offline computation. Here the optimal trellis structure can be derived without the need of demodulated soft-input bits, so it can be done before decoding starts.

In sub-method 1 of method 1, the self-context redundancy is explored by removing the trellis states corresponding to invalid bit allocations.

Figure 3:
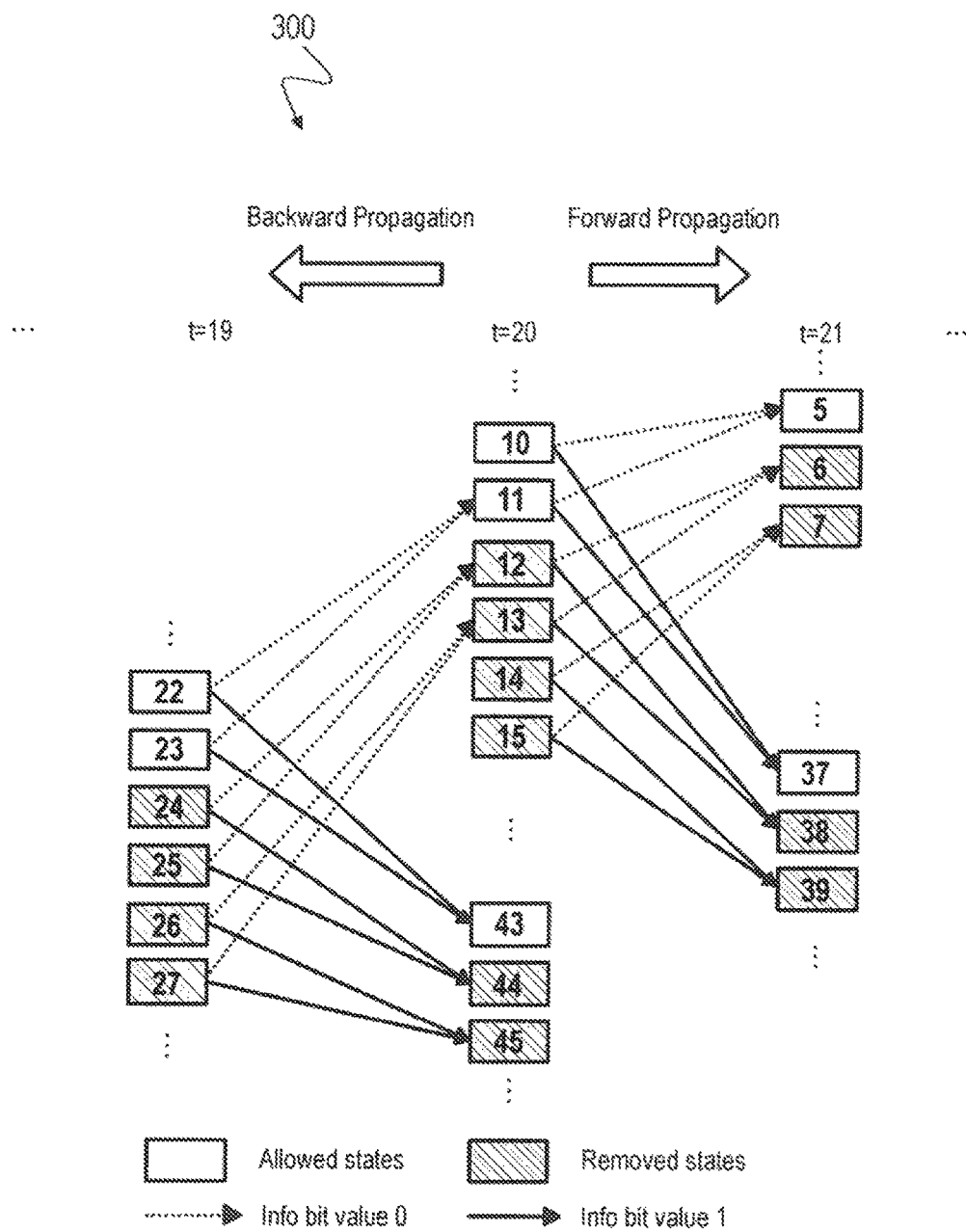
FIG. 3 is an exemplary section of a trellis diagram illustrating an exemplary state propagation process according to the disclosure.

FIG. 3 shows an example for forbidden stage propagation including backward propagation and forward propagation as described in the following. The forbidden state propagation process can be done in an iterative way until all invalid states are cleared.

For example, the Viterbi decoder for PSBCH contains trellis states per stage. That is because there are shift registers of the encoder that contain 6 bits ($64=2^6$). From MSB to LSB, an information field is right shifted into state register in the corresponding stage of the trellis. For example, for the field of side link bandwidth 402 as shown in FIG. 4, it occupies bit 0-bit 2 of side link MIB. So the states in stage t=3 are represented in the following format: $I_0I_1I_2XXX$, where the $I_2I_1I_0$ are the information bits for side-link bandwidth field and $I_2$ is MSB of it. XXX is representing the other 3 free bits in the state register which is unknown. Note that the information bits are flipped due to the shifting behavior.

Figure 4:
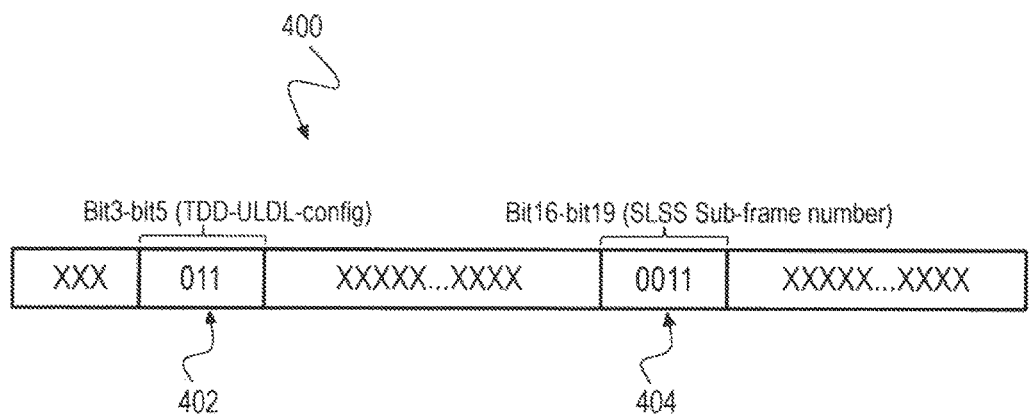
FIG. 4 is an example of an invalid field combination in an exemplary side link information field according to the disclosure.

Considering the self-context redundancy of side link bandwidth field 402 as shown in FIG. 4, it can only range from 0 to 5, value 6 $(110)_2$ and 7 $(111)_2$ are invalid, so it means the trellis stages in stage 3 which is encoded as '111XXX' and '011XXX' can be removed because they are invalid. It results in 2*2^3=16 removed states. Note that for implementation, the path metric of the invalid states can be forced to be a very high value, and then it behaves equivalently like being removed.

Similarly, considering the self-context redundancy of SLSS sub-frame index field 404 as shown in FIG. 4 (it is located in bit 16-bit 19 of side link MIB), it can only range from 0 to 9, so that value 10 to 15 are invalid. So it means the trellis stages in stage t=20 as illustrated in FIG. 3 which is encoded as '1111XX', '0111XX', '1011XX', '0011XX', '1101XX' and "0101XX" can be removed because they are invalid. It results in 6*2^2=24 removed states.

After the invalid states in the main stages (state t=3 for side link bandwidth field 402, state t=20 for SLSS sub-frame index field 404) are removed, the further actions can be performed: For any of the states in earlier stages, if both of its out-coming paths lead to an invalid state, this state can also be removed. For example, in stage t=19, states coded with '011XXX' will lead to either '1011XX' or '0011XX' in stage t=20, see FIG. 3. But it is known that both destination states are invalid, so states coded with '011XXX' in stage t=19 can be removed, see FIG. 3 illustrating the removed states in stage t=19 (24, 25, 26, 27). In parallel, for any of the states in later stages, if both of its in-coming paths are from two invalid states, this state can also be removed. For example, in stage t=20, the invalid states coded with '0011XX' can only lead to destination state 'X0011X' in stage t =21. The latter states can therefore also be removed in stage t=21. See FIG. 3 where in stage t=20 the states 12, 13, 14, 15 and 44, 45 can be removed and where in stage t=21 the states 6, 7 and 38, 39 can be removed.

In sub-method 2 of method 1, the cross-context redundancy between TDD-ULDL-config field 402 (see FIG. 4) and SLSS sub-frame field 404 (see FIG. 4) is explored by checking invalid field combinations to further reduce the trellis. An approach is to offline setup a table with all invalid field combinations. For example, TDD-ULDL-config two, together with SLSS sub-frame number of 3 generates an invalid field combination: in TDD-ULDL-config two, sub-frame index 3 is a DL sub-frame but D2D SLSS sub-frame in TDD mode can only be an UL sub-frame. Such example of invalid field combination is further shown in FIG. 4.

Note that an invalid field combination results in not only 1 path but 2^(40-7), i.e. 2 to the power of 33 paths through the complete trellis of the PSBCH Viterbi decoder. The total number of invalid paths is M*2^(40-7) where M is the total number of invalid field combinations between TDD-ULDL-config 402 and SLSS Sub-frame 404 number. After getting all invalid paths, they are marked in the Viterbi decoder trellis. And then, states which can only be reached by invalid paths are declared to be invalid states and can be removed from the trellis. This process can be performed offline by PC simulation, for example and so it does not introduce any complexity to real decoder implementation.

For method 2, the PSBCH cross-context redundancy is explored to disable invalid states in decoding run-time. Here demodulated soft-input bits may be required. More specifically, during the Viterbi decoding process, before reaching the state for the field of SLSS Sub-frame number field, early trace back can be done and then the TDD-ULDL-config field 402 can be decoded beforehand. Then, based on the decoded TDD-ULDL-config field 402 the SLSS sub-frame number fields can be better restricted and therefore more invalid states can be disabled which are corresponding to it. For example, when the decoding result of TDD-ULDL-config 402 is 2, then it is known that the valid values for SLSS Sub-frame number can only be 2 or 7. This further restricts the number of possible SLSS Sub-frame index from 10 down to 2.

The way of removing invalid states are is the same as in sub-method 1 of method 1, but now more trellis stages in stage 20 can be removed. It results in a total number of 8*2^2=48 removed states in stage 20. The more invalid states are removed the better decoding sensitivity can be achieved. For implementation, the path metric of the invalid states can be forced to be a very high value, and then it behaves equivalently like being removed.

Figure 5:
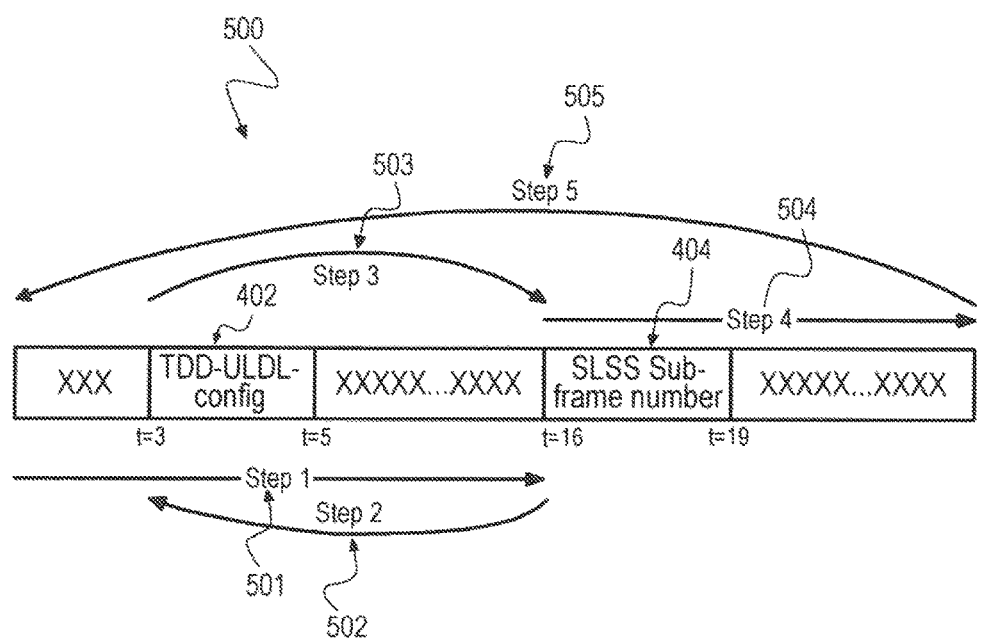
FIG. 5 is an example of processing a side link information field by exploiting context redundancy according to the disclosure.

The procedure of method 2 is shown in FIG. 5: The first step 501 includes trellis path metric computation and path selection until the first bit of SLSS sub-frame number field 404. The second step 502 includes early trellis trace back to detect TDD-ULDL config 402. The third step 503 includes forbid more invalid states for invalid SLSS-sub-frame 404 numbers based on detected TDD-ULDL-config 402. The fourth step 504 includes continue with trellis path metric computation and path selection until the final information bit. The fifth step 505 includes do final trace back to decode the full stream.

An early trace back as described herein means a trace back at an early stage in the trellis in order to early decode the context redundancy information and hence to restrict of remove unused trellis states as early as possible.

Figure 6:
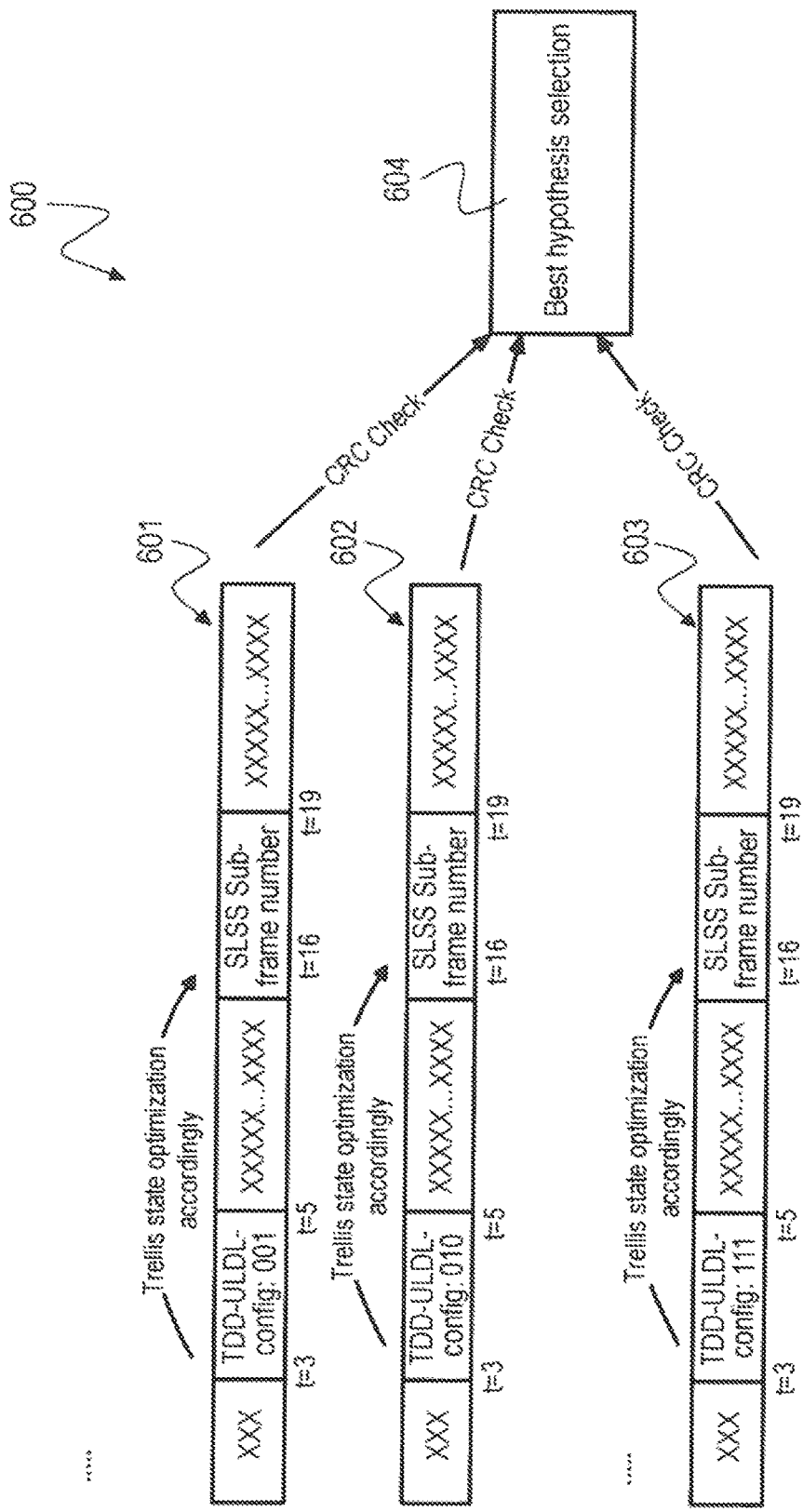
FIG. 6 schematically illustrates an exemplary decoding method 600 using applying a hypothesis based approach according to the disclosure.

In the modified version of method 2, e.g. as shown in FIG. 6, early TDD-ULDL-Config decoding step can be replaced by a hypothesis based approach while leaving the remaining parts the same. In the modified version of method 2, instead of doing early trace back to early decode TDD-ULDL-config, a different hypothesis of different possible TDD-ULDL configurations can be put. For example a first hypothesis is applied to a first possible TDD-ULDL configuration 601, a second hypothesis is applied to a second possible TDD-ULDL configuration 602, a third hypothesis is applied to a third possible TDD-ULDL configuration 603, etc. Then, for each hypothesis PSBCH decoding can be done separately as shown in FIG. 6.

For each hypothesis, during the Viterbi decoding processing, when reaching the stage of TDD-ULDL-config field 402, the trellis state which is violating the assumed TDD-ULDL-config 402 value can be disabled. And then, when reaching the SLSS sub-frame number 404 field, based on each TDD-ULDL-config 402 hypothesis, the invalid trellis states can be further removed based on further conflicting SLSS sub-frame number field values. Again, the way of forbidding invalid states corresponding to SLSS sub-frame fields are the same like in method 1, but just more states can be forbidden or removed compared with method 1. In this modified version of method 2, there may be maximal 8 hypotheses, for example. The whole decoded bit stream that passes CRC check is selected to give the best hypothesis selection 604 and thus the final decoded information bits. The modified version of method 2 gives even better sensitivity because the plenty of false detection rate of early TDD-ULDL-config 402 decoding can be avoided. However, it may need higher computation power because PSBCH decoding may be performed more than once.

This concept and method can be implemented in control channel decoder, for example in the outer control channel receiver (OCRX) within LTE PHY. It provides better PSBCH decoding performance for D2D communications and therefore better link quality.

Figure 7:
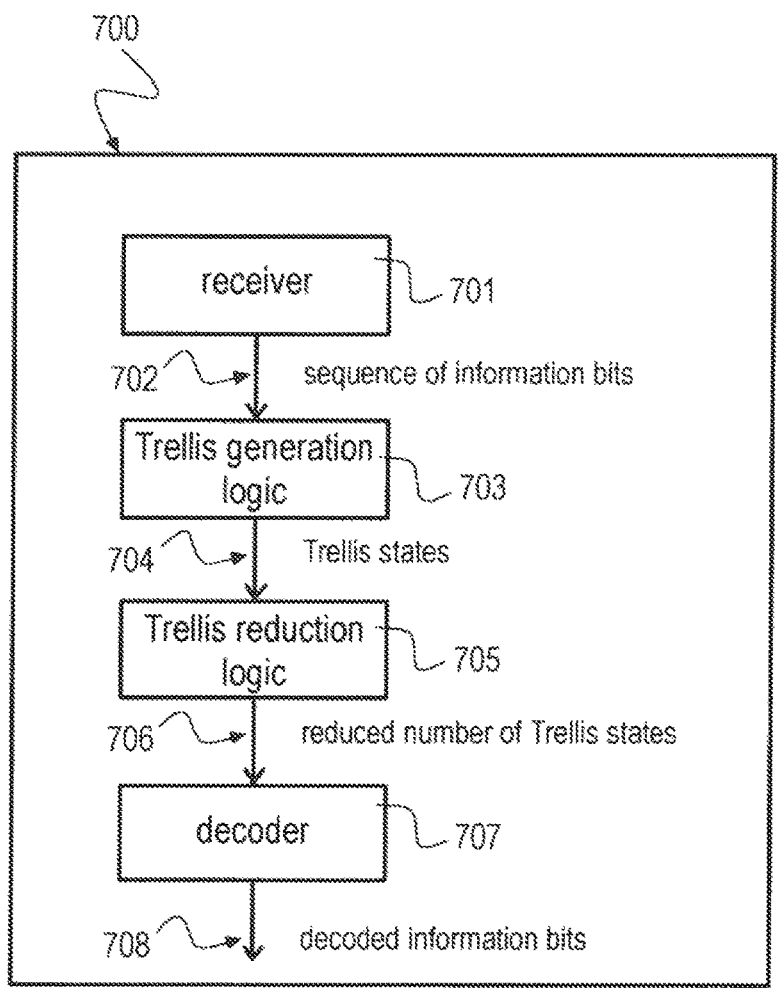
FIG. 7 schematically illustrates an exemplary decoding device 700 according to the disclosure.

FIG. 7 schematically illustrates an exemplary decoding device 700 according to the disclosure. The decoding device 700 may implement any one of the methods 200 or modified versions of the method 200 as described above with respect to FIGS. 2 to 6.

The decoding device 700 includes a receiver 701, a trellis generation logic 703, a trellis reduction logic 705 and a decoder 707. These units may be implemented as circuits in hardware or as blocks or modules in software. The receiver 701 provides a sequence of information bits 702 including context redundancy information, e.g. as described above with respect to FIGS. 2 to 6, wherein the sequence of information bits 702 is encoded based on a predefined channel code, e.g. as described above with respect to FIG. 1. The trellis generation logic 703 generates a plurality of trellis states 704 based on the sequence of information bits 702 and the channel code. The trellis reduction logic 705 reduces the plurality of trellis states by at least one trellis state based on the context redundancy information, e.g. as described above with respect to FIGS. 2 to 6. The decoder 707 decodes the sequence of information bits 702 by using a metric based on the reduced number of trellis states 706. The metric may be a distance, e.g. Hamming distance or any metric that is used by a Viterbi decoder for performing the Viterbi decoding.

The context redundancy information may be provided at predefined positions of the sequence of information bits, e.g. as described above with respect to FIGS. 2 to 6. The context redundancy information may be provided as a bit field comprising at least one invalid bit combination, e.g. as described above with respect to FIGS. 2 to 6. The sequence of information bits 702 may be correlated by the context redundancy information before being encoded based on the channel code. The trellis reduction logic 705 may be configured to remove trellis states which correspond to invalid bit allocations in the sequence of information bits, e.g. as described above with respect to FIGS. 2 to 6.

The trellis reduction logic 705 may remove trellis states which correspond to invalid field combinations in the sequence of information bits, e.g. as described above with respect to FIGS. 2 to 6. The trellis reduction logic 705 may remove trellis states which can only be reached by invalid paths, e.g. as described above with respect to FIGS. 2 to 6. The trellis reduction logic 705 may provide the reduced number of trellis states during an offline operation of the decoding device, e.g. as described above with respect to FIGS. 2 to 6. The trellis reduction logic 705 may provide the reduced number of trellis states during an online operation of the decoding device. The trellis reduction logic 705 may provide the reduced number of trellis states based on trace back for decoding the context redundancy information, e.g. as described above with respect to FIGS. 2 to 6. The trellis reduction logic 705 may use the decoded context redundancy information to restrict the plurality of trellis states, e.g. as described above with respect to FIGS. 2 to 6. The trellis reduction logic 705 may provide the reduced number of trellis states based on evaluating probabilities for different possible context redundancy information.

The trellis reduction logic 705 may provide the reduced number of trellis states 706 based on evaluating hypotheses of different possible context redundancy information, e.g. as described above with respect to FIG. 6. The trellis reduction logic 705 may evaluate the hypotheses based on a cyclic redundancy check, e.g. as described above with respect to FIG. 6.

The context redundancy information may include self-context redundancy information and/or cross-context redundancy information, e.g. as described above with respect to FIGS. 2 to 6. The self-context redundancy information may include self-context redundancy of a bit field indicating a side link bandwidth within a side link master information block (SL-MIB) for device-to-device (D2D) communication, e.g. as described above with respect to FIG. 4. The cross-context redundancy information may include cross-context redundancy between a bit field indicating a time division duplex uplink downlink (TDD-ULDL) configuration and the bit field indicating the side link bandwidth within the side link master information block (SL-MIB) for device-to-device (D2D) communication, e.g. as described above with respect to FIG. 4. The decoder 707 may decode the sequence of information bits 702 based on Viterbi decoding.

Figure 8:
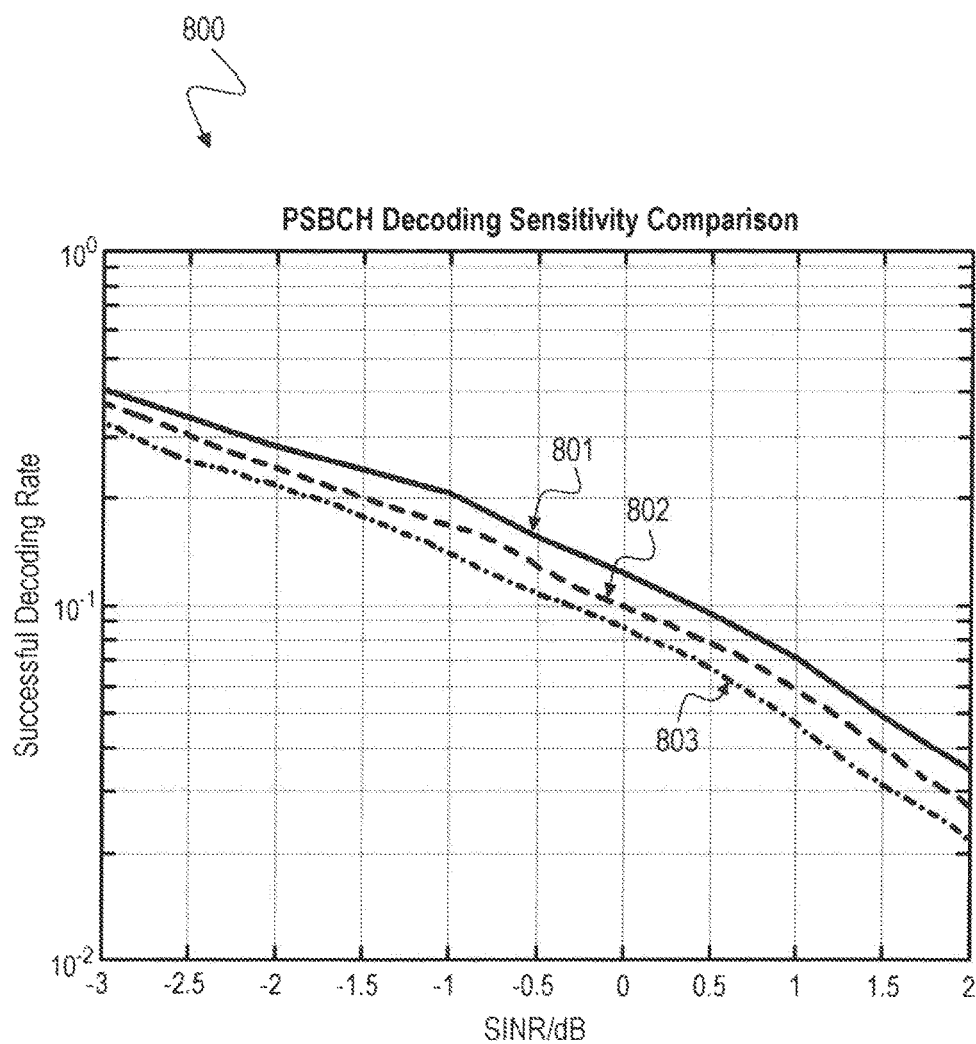
FIG. 8 is a performance diagram illustrating the decoding sensitivity of a decoding method according to the disclosure.

FIG. 8 is a performance diagram illustrating the decoding sensitivity in terms of successful decoding rate over SINR in dB of a decoding method according to the disclosure. A first graph 801 shows the performance of PSBCH decoding without using context redundancy. A second graph 802 shows the performance of enhanced PSBCH decoding exploring context redundancy according to method 2 alone. A third graph 803 shows the performance of enhanced PSBCH decoding exploring context redundancy according to a combination of method 1 and method 2.

Compared with PSBCH decoding without exploiting context redundancy 801, the disclosed concept to exploit context redundancy in the decoding improves the decoding sensitivity, in particular under low SINR conditions. Meanwhile, the offline trellis reduction also reduces the computation power and computation complexity for a Viterbi decoder. From FIG. 8 can be seen that by using method 2 only 802 already shows about 0.4 dB gain improvement. It also shows that a combination 803 of method 1 and method 2 gives a further 0.25 dB gain improvement.

EXAMPLES

The following examples pertain to further embodiments. Example 1 is a decoding device, comprising: a receiver configured to provide a sequence of information bits comprising context redundancy information, wherein the sequence of information bits is encoded based on a predefined channel code; a trellis generation logic configured to generate a plurality of trellis states based on the sequence of information bits and the channel code; a trellis reduction logic configured to reduce the plurality of trellis states by at least one trellis state based on the context redundancy information; and a decoder configured to decode the sequence of information bits by using a metric based on the reduced number of trellis states.

In Example 2, the subject matter of Example 1 can optionally include that the context redundancy information is provided at predefined positions of the sequence of information bits.

In Example 3, the subject matter of any one of Examples 1-2 can optionally include that the context redundancy information is provided as a bit field comprising at least one invalid bit combination.

In Example 4, the subject matter of any one of Examples 1-3 can optionally include that the sequence of information bits is correlated by the context redundancy information before being encoded based on the channel code.

In Example 5, the subject matter of any one of Examples 1-4 can optionally include that the trellis reduction logic is configured to remove trellis states which correspond to invalid bit allocations in the sequence of information bits.

In Example 6, the subject matter of any one of Examples 1-5 can optionally include that the trellis reduction logic is configured to remove trellis states which correspond to invalid field combinations in the sequence of information bits.

In Example 7, the subject matter of any one of Examples 1-6 can optionally include that the trellis reduction logic is configured to remove trellis states which can only be reached by invalid paths.

In Example 8, the subject matter of any one of Examples 1-7 can optionally include that the trellis reduction logic is configured to provide the reduced number of trellis states during an offline operation of the decoding device.

In Example 9, the subject matter of any one of Examples 1-8 can optionally include that the trellis reduction logic is configured to provide the reduced number of trellis states during an online operation of the decoding device.

In Example 10, the subject matter of Example 9 can optionally include that the trellis reduction logic is configured to provide the reduced number of trellis states based on trace back for decoding the context redundancy information.

In Example 11, the subject matter of Example 10 can optionally include that the trellis reduction logic is configured to use the decoded context redundancy information to restrict the plurality of trellis states.

In Example 12, the subject matter of Example 9 can optionally include that the trellis reduction logic is configured to provide the reduced number of trellis states based on evaluating probabilities for different possible context redundancy information.

In Example 13, the subject matter of Example 12 can optionally include that the trellis reduction logic is configured to provide the reduced number of trellis states based on evaluating hypotheses of different possible context redundancy information.

In Example 14, the subject matter of Example 13 can optionally include that the trellis reduction logic is configured to evaluate the hypotheses based on a cyclic redundancy check.

In Example 15, the subject matter of any one of Examples 1-14 can optionally include that the context redundancy information comprises at least one of self-context redundancy information and cross-context redundancy information.

In Example 16, the subject matter of Example 15 can optionally include that the self-context redundancy information comprises self-context redundancy of a bit field indicating a side link bandwidth within a side link master information block (SL-MIB) for device-to-device (D2D) communication.

In Example 17, the subject matter of Example 16 can optionally include that the cross-context redundancy information comprises cross-context redundancy between a bit field indicating a time division duplex uplink downlink (TDD-ULDL) configuration and the bit field indicating the side link bandwidth within the side link master information block (SL-MIB) for device-to-device (D2D) communication.

In Example 18, the subject matter of any one of Examples 1-17 can optionally include that the decoder is configured to decode the sequence of information bits based on Viterbi decoding.

Example 19 is a decoding method, comprising: providing a sequence of information bits comprising context redundancy information, wherein the sequence of information bits is encoded based on a predefined channel code; generating a plurality of trellis states based on the sequence of information bits and the channel code; reducing the plurality of trellis states by at least one trellis state based on the context redundancy information; and decoding the sequence of information bits by using a metric based on the reduced number of trellis states.

In Example 20, the subject matter of Example 19 can optionally include that the context redundancy information is provided at predefined positions of the sequence of information bits.

In Example 21, the subject matter of any one of Examples 19-20 can optionally include that the context redundancy information is provided as a bit field comprising at least one invalid bit combination.

In Example 22, the subject matter of any one of Examples 19-21 can optionally include that the sequence of information bits is correlated by the context redundancy information before being encoded by the channel code.

In Example 23, the subject matter of any one of Examples 19-22 can optionally include removing trellis states which correspond to invalid bit allocations in the sequence of information bits.

In Example 24, the subject matter of any one of Examples 19-23 can optionally include removing trellis states which correspond to invalid field combinations in the sequence of information bits.

In Example 25, the subject matter of any one of Examples 19-24 can optionally include removing trellis states which can only be reached by invalid paths.

In Example 26, the subject matter of any one of Examples 19-25 can optionally include providing the reduced number of trellis states during an offline processing.

In Example 27, the subject matter of any one of Examples 19-26 can optionally include providing the reduced number of trellis states during an online processing.

In Example 28, the subject matter of Example 27 can optionally include providing the reduced number of trellis states based on trace back for decoding the context redundancy information.

In Example 29, the subject matter of Example 28 can optionally include using the decoded context redundancy information to restrict the plurality of trellis states.

In Example 30, the subject matter of Example 27 can optionally include providing the reduced number of trellis states based on evaluating probabilities for different possible context redundancy information.

In Example 31, the subject matter of Example 30 can optionally include providing the reduced number of trellis states based on evaluating hypotheses of different possible context redundancy information.

In Example 32, the subject matter of Example 31 can optionally include evaluating the hypotheses based on a cyclic redundancy check.

In Example 33, the subject matter of any one of Examples 19-32 can optionally include that the context redundancy information comprises at least one of self-context redundancy information and cross-context redundancy information.

In Example 34, the subject matter of Example 33 can optionally include that the self-context redundancy information comprises self-context redundancy of a bit field indicating a side link bandwidth within a side link master information block (SL-MIB) for device-to-device (D2D) communication.

In Example 35, the subject matter of any one of Examples 33-34 can optionally include that the cross-context redundancy information comprises cross-context redundancy between a bit field indicating a time division duplex uplink downlink (TDD-ULDL) configuration and a bit field indicating a sub-frame number (SLSS).

In Example 36, the subject matter of any one of Examples 19-35 can optionally include decoding the sequence of information bits based on Viterbi decoding.

Example 37 is a decoding method, comprising: providing a sequence of information bits comprising self-context redundancy information and cross-context redundancy information, wherein the sequence of information bits is encoded based on a predefined channel code; generating a plurality of trellis states based on the sequence of information bits and the channel code during offline processing; reducing the plurality of trellis states by at least one trellis state based on the self-context redundancy information and the cross-context redundancy information during the offline processing; and using the reduced plurality of trellis states for decoding a sequence of information bits during an online processing.

In Example 38, the subject matter of Example 37 can optionally include providing the self-context redundancy information and the cross-context redundancy information at predefined positions of the sequence of information bits.

In Example 39, the subject matter of any one of Examples 37-38 can optionally include providing the self-context redundancy information and the cross-context redundancy information as bit fields comprising at least one invalid bit combination.

In Example 40, the subject matter of any one of Examples 37-39 can optionally include that the sequence of information bits is correlated by the self-context redundancy information and the cross-context redundancy information before being encoded by the channel code.

In Example 41, the subject matter of any one of Examples 37-40 can optionally include removing trellis states which correspond to invalid bit allocations in the sequence of information bits.

In Example 42, the subject matter of any one of Examples 37-41 can optionally include removing trellis states which correspond to invalid field combinations in the sequence of information bits.

In Example 43, the subject matter of any one of Examples 37-42 can optionally include removing trellis states which can only be reached by invalid paths.

Example 44 is a decoding method, comprising: providing a sequence of information bits comprising cross-context redundancy information, wherein the sequence of information bits is encoded based on a predefined channel code; generating a plurality of trellis states based on the sequence of information bits and the channel code during an online processing; reducing the plurality of trellis states by at least one trellis state based on the cross-context redundancy information; and decoding the sequence of information bits by using a metric based on the reduced number of trellis states.

In Example 45, the subject matter of Example 44 can optionally include providing the reduced number of trellis states based on trace back for decoding the context redundancy information.

In Example 46, the subject matter of Example 45 can optionally include using the decoded context redundancy information to restrict the plurality of trellis states.

In Example 47, the subject matter of Example 44 can optionally include providing the reduced number of trellis states based on evaluating probabilities for different possible context redundancy information.

In Example 48, the subject matter of Example 47 can optionally include providing the reduced number of trellis states based on evaluating hypotheses of different possible context redundancy information.

In Example 49, the subject matter of Example 48 can optionally include evaluating the hypotheses based on a cyclic redundancy check.

In Example 50, the subject matter of any one of Examples 44-49 can optionally include that the cross-context redundancy information comprises cross-context redundancy between a bit field indicating a time division duplex uplink downlink (TDD-ULDL) configuration and a bit field indicating a sub-frame number (SLSS).

In Example 51, the subject matter of any one of Examples 44-50 can optionally include decoding the sequence of information bits based on Viterbi decoding.

Example 52 is a computer readable non-transitory medium on which computer instructions are stored which when executed by a computer, cause the computer to perform the decoding method of any one of Examples 19 to 51.

Example 53 is a coding system, comprising: an encoding device configured to provide a sequence of information bits comprising context redundancy information, wherein the sequence of information bits is encoded based on a predefined channel code; a decoding device according to any one of Examples 1 to 18, wherein the receiver of the decoding device is configured to receive the sequence of information bits encoded by the encoding device.

In Example 54, the subject matter of Example 53 can optionally include that the encoding device is configured to provide the context redundancy information at predefined positions of the sequence of information bits.

Example 55 is a decoding device, comprising: means for providing a sequence of information bits comprising context redundancy information, wherein the sequence of information bits is encoded based on a predefined channel code; means for generating a plurality of trellis states based on the sequence of information bits and the channel code; means for reducing the plurality of trellis states by at least one trellis state based on the context redundancy information; and means for decoding the sequence of information bits by using a metric based on the reduced number of trellis states.

In Example 56, the subject matter of Example 55 can optionally include means for removing trellis states which correspond to invalid bit allocations in the sequence of information bits.

In Example 57, the subject matter of any one of Examples 55-56 can optionally include means for removing trellis states which correspond to invalid field combinations in the sequence of information bits.

In Example 58, the subject matter of any one of Examples 55-57 can optionally include means for removing trellis states which can only be reached by invalid paths.

In addition, while a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it is understood that aspects of the disclosure may be implemented in discrete circuits, partially integrated circuits or fully integrated circuits or programming means. Also, the terms "exemplary", "for example" and "e.g." are merely meant as an example, rather than the best or optimal.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A decoding device, comprising:
a receiver configured to provide a sequence of information bits comprising context redundancy information, wherein the sequence of information bits is encoded based on a predefined channel code;
a trellis generation logic configured to generate a plurality of trellis states based on the sequence of information bits and the channel code;
a trellis reduction logic configured to reduce a number of the plurality of trellis states by at least one trellis state based on the context redundancy information, wherein the trellis reduction logic is configured to provide the reduced number of the plurality of trellis states during an online operation of the decoding device, wherein the trellis reduction logic is configured to provide the reduced number of the plurality of trellis states based on evaluating probabilities for different possible context redundancy information; and
a decoder configured to decode the sequence of information bits by using a metric based on the reduced number of trellis states.

2. The decoding device of claim 1,
wherein the context redundancy information is provided at predefined positions of the sequence of information bits.

3. The decoding device of claim 1,
wherein the context redundancy information is provided as a bit field comprising at least one invalid bit combination.

4. The decoding device of claim 1,
wherein the sequence of information bits is correlated by the context redundancy information before being encoded based on the channel code.

5. The decoding device of claim 1,
wherein the trellis reduction logic is configured to remove trellis states which correspond to invalid bit allocations in the sequence of information bits.

6. The decoding device of claim 1,
wherein the trellis reduction logic is configured to remove trellis states which correspond to invalid field combinations in the sequence of information bits.

7. The decoding device of claim 1,
wherein the trellis reduction logic is configured to remove trellis states which are only reached by invalid paths.

8. The decoding device of claim 1,
wherein the trellis reduction logic is configured to provide the reduced number of trellis states based on trace back for decoding the context redundancy information.

9. The decoding device of claim 8,
wherein the trellis reduction logic is configured to use the decoded context redundancy information to restrict the plurality of trellis states.

10. The decoding device of claim 1,
wherein the trellis reduction logic is configured to provide the reduced number of trellis states based on evaluating hypotheses of different possible context redundancy information.

11. The decoding device of claim 10,
wherein the trellis reduction logic is configured to evaluate the hypotheses based on a cyclic redundancy check.

12. The decoding device of claim 1,
wherein the context redundancy information comprises at least one of self-context redundancy information and cross-context redundancy information.

13. The decoding device of claim 12,
wherein the self-context redundancy information comprises self-context redundancy of a bit field indicating a side link bandwidth within a sidelink master information block (SL-MIB) for device-to-device (D2D) communication.

14. The decoding device of claim 13,
wherein the cross-context redundancy information comprises cross-context redundancy between a bit field indicating a time division duplex uplink downlink (TDD-ULDL) configuration and the bit field indicating the side link bandwidth within the sidelink master information block (SL-MIB) for device-to-device (D2D) communication.

15. The decoding device of claim 1,
wherein the decoder is configured to decode the sequence of information bits based on Viterbi decoding.

16. A decoding method, comprising:
providing a sequence of information bits comprising context redundancy information, wherein the sequence of information bits is encoded based on a predefined channel code;
generating a plurality of trellis states based on the sequence of information bits and the channel code;
reducing a number of the plurality of trellis states by at least one trellis state based on the context redundancy information, wherein the reduced number of the plurality of trellis states are provided during an online operation of a decoding device, wherein the reduced number of the plurality of trellis states are provided based on evaluating probabilities for different possible context redundancy information; and
decoding the sequence of information bits by using a metric based on the reduced number of trellis states.

17. The decoding method of claim 16,
wherein the context redundancy information is provided at predefined positions of the sequence of information bits.

18. The decoding method of claim 16,
wherein the context redundancy information is provided as a bit field comprising at least one invalid bit combination.
19. The decoding method of claim 16,
wherein the sequence of information bits is correlated by the context redundancy information before being encoded by the channel code.
20. The decoding method of claim 16, comprising:
removing trellis states which correspond to invalid bit allocations in the sequence of information bits.
21. A decoding method, comprising:
providing a sequence of information bits comprising self-context redundancy information and cross-context redundancy information, wherein the sequence of information bits is encoded based on a predefined channel code;
generating a plurality of trellis states based on the sequence of information bits and the channel code during offline processing;
reducing the plurality of trellis states by at least one trellis state based on the self-context redundancy information and the cross-context redundancy information during the offline processing; and
using the reduced plurality of trellis states for decoding a sequence of information bits during an online processing.
22. The decoding method of claim 21, comprising:
providing the self-context redundancy information and the cross-context redundancy information at predefined positions of the sequence of information bits.

\* \* \* \* \*